US009217785B2

(12) United States Patent
Furudate (10) Patent No.: US 9,217,785 B2
(45) Date of Patent: Dec. 22, 2015

(54) MAGNETIC RESONANCE IMAGING APPARATUS AND MAGNETIC RESONANCE IMAGING METHOD

(71) Applicant: Naoyuki Furudate, Otawara (JP)

(72) Inventor: Naoyuki Furudate, Otawara (JP)

(73) Assignees: KABUSHIKI KAISHA TOSHIBA, Tokyo (JP); TOSHIBA MEDICAL SYSTEMS CORPORATION, Tochigi (JP)

( * ) Notice: Subject to any disclaimer, the term of this patent is extended or adjusted under 35 U.S.C. 154(b) by 434 days.

(21) Appl. No.: 13/714,882

(22) Filed: Dec. 14, 2012

(65) Prior Publication Data

US 2013/0154645 A1 Jun. 20, 2013

(30) Foreign Application Priority Data

Dec. 14, 2011 (JP) .................................. 2011-273176
Oct. 5, 2012 (JP) .................................. 2012-223006

(51) Int. Cl.
*G01V 3/00* (2006.01)
*G01R 33/54* (2006.01)
*G01R 33/483* (2006.01)

(52) U.S. Cl.
CPC .............. *G01R 33/54* (2013.01); *G01R 33/546* (2013.01); *G01R 33/4833* (2013.01)

(58) Field of Classification Search
CPC .................................................... G01R 33/546
USPC ........................................ 324/314, 309, 307
See application file for complete search history.

(56) References Cited

U.S. PATENT DOCUMENTS

| 7,081,750 B1* | 7/2006 | Zhang ........................... 324/309 |
| 7,808,239 B2* | 10/2010 | Miyazaki ....................... 324/309 |
| 2009/0005670 A1 | 1/2009 | Ichinose et al. |
| 2009/0245607 A1* | 10/2009 | Sugiura ......................... 382/131 |

FOREIGN PATENT DOCUMENTS

CN 101548889 A 10/2009

OTHER PUBLICATIONS

Office Action issued Jan. 23, 2015 in CN Patent Application No. 201210495066.3.
Office Action issued Jun. 25, 2014 in CN Patent Application No. 201210495066.3.
Office Action (final rejection) issued Sep. 8, 2015 in CN Patent Application No. 201210495066.3.

* cited by examiner

*Primary Examiner* — Louis Arana
(74) *Attorney, Agent, or Firm* — Nixon & Vanderhye P.C.

(57) ABSTRACT

According to one embodiment, a magnetic resonance imaging apparatus includes an imaging condition setting unit and an imaging unit. The imaging condition setting unit is configured to display a setting screen of a radio frequency prepulse on a display unit to set imaging conditions including application timings of radio frequency prepulses according to input information from an input device through the setting screen. The setting screen displays an application timing of a radio frequency excitation pulse and the application timings of the radio frequency prepulses on a time axis. The imaging unit is configured to perform imaging of an object according to the imaging condition.

16 Claims, 6 Drawing Sheets

MAGNETIC RESONANCE IMAGING APPARATUS AND MAGNETIC RESONANCE IMAGING METHOD

CROSS REFERENCES TO RELATED APPLICATIONS

This application is based upon and claims the benefit of priorities from Japanese Patent Application No. 2011-273176 filed on Dec. 14, 2011 and Japanese Patent Application No. 2012-223006 filed on Oct. 5, 2012; the entire contents of Japanese Patent Application No. 2011-273176 and Japanese Patent Application No. 2012-223006 are incorporated herein by reference.

FIELD

Embodiments described herein relate generally to a MRI (magnetic resonance imaging) apparatus and a magnetic resonance imaging method.

BACKGROUND

The MRI apparatus is an image diagnostic apparatus which excites nuclear spin of an object set in a static magnetic field with a RF (radio frequency) signal having the Larmor frequency magnetically and reconstruct an image based on MR (magnetic resonance) signals generated due to the excitation.

In MRI, various prepulses are applied as RF pulses prior to data acquisition for obtaining an image having a desired contrast. For example, in a magnetic resonance angiography (MRA) which performs imaging of blood vessels, a spin labeling pulse (also referred to a tagging pulse or a labeling pulse) is applied for obtaining a difference in contrast between a blood flow and a background tissue.

The spin labeling pulse is a prepulse for tagging spins including in a fluid such as a blood and a cerebrospinal fluid (CSF) which flows in an imaging section. Especially, the spin labeling pulse for blood is called an arterial spin labeling (ASL) pulse.

A time-spatial labeling inversion pulse (t-SLIP) is known as a representative spin labeling pulse used for a non-contrast-enhanced MRA. The t-SLIP consists of a region non-selective inversion recovery (IR) pulse and a region selective IR pulse. The region selective IR pulse can be set arbitrarily and independently from an imaging region. Therefore, when a labeling region is labeled with a region selective IR pulse, so that MR signals from blood in a specific region are enhanced, while MR signals are suppressed with a non-selective IR pulse, the blood which flows out of the labeling region after an inversion time (TI) can be depicted selectively as a high signal intensity part.

Note that, the region non-selective IR pulse can be switched between ON and OFF. When the region non-selective IR pulse is OFF, signals from blood included in a labeling region are suppressed by applying a region selective IR pulse. Therefore, the blood which flows out of the labeling region after a TI is depicted as a low signal intensity part.

Other than the t-SLIP as described above, an RF pulse such as a saturation pulse is used for adjusting a contrast. A pre-saturation (Presat) pulse which is applied as an RF prepulse is a prepulse for suppressing signals from a desired matter by saturating spins in the desired matter.

The RF prepulses, which are applied for adjusting a contrast, including the t-SLIP and the Presat pulse, can be combined mutually. Specifically, MR images having various contrasts can be acquired by applying same or different types of region selective RF prepulses or region non-selective RF prepulses prior to a data acquisition.

Accordingly, for setting these RF prepulses, a graphical user interface (GUI), which displays a TI of a target IR pulse with a schematic diagram showing an R wave interval of an electro cardiogram (ECG) signal used as a synchronizing signal, is used as a setting screen of imaging conditions. Furthermore, a GUI for setting respective application regions of RF prepulses with displaying the application regions is used as a locator.

It is desirable to provide a GUI clearer for a user in order to set applications of plural RF prepulses such as IR pulses easily.

Accordingly, it is an object of the present invention to provide a magnetic resonance imaging apparatus and a magnetic resonance imaging method which can indicate a setting status of plural RF prepulses to a user more clearly in a case of setting applications of the RF prepulses.

DETAILED DESCRIPTION

In general, according to one embodiment, a magnetic resonance imaging apparatus includes an imaging condition setting unit and an imaging unit. The imaging condition setting unit is configured to display a setting screen of a radio frequency prepulse on a display unit to set imaging conditions including application timings of radio frequency prepulses according to input information from an input device through the setting screen. The setting screen displays an application timing of a radio frequency excitation pulse and the application timings of the radio frequency prepulses on a time axis. The imaging unit is configured to perform imaging of an object according to the imaging conditions.

Further, according to another embodiment, a magnetic resonance imaging method includes: displaying a setting screen of a radio frequency prepulse on a display unit to set imaging conditions including application timings of radio frequency prepulses according to input information from an input device through the setting screen; and performing imaging of an object according to the imaging conditions. The setting screen displays an application timing of a radio frequency excitation pulse and the application timings of the radio frequency prepulses on a time axis.

A magnetic resonance imaging apparatus and a magnetic resonance imaging method according to embodiments of the present invention will be described with reference to the accompanying drawings.

Figure 1:
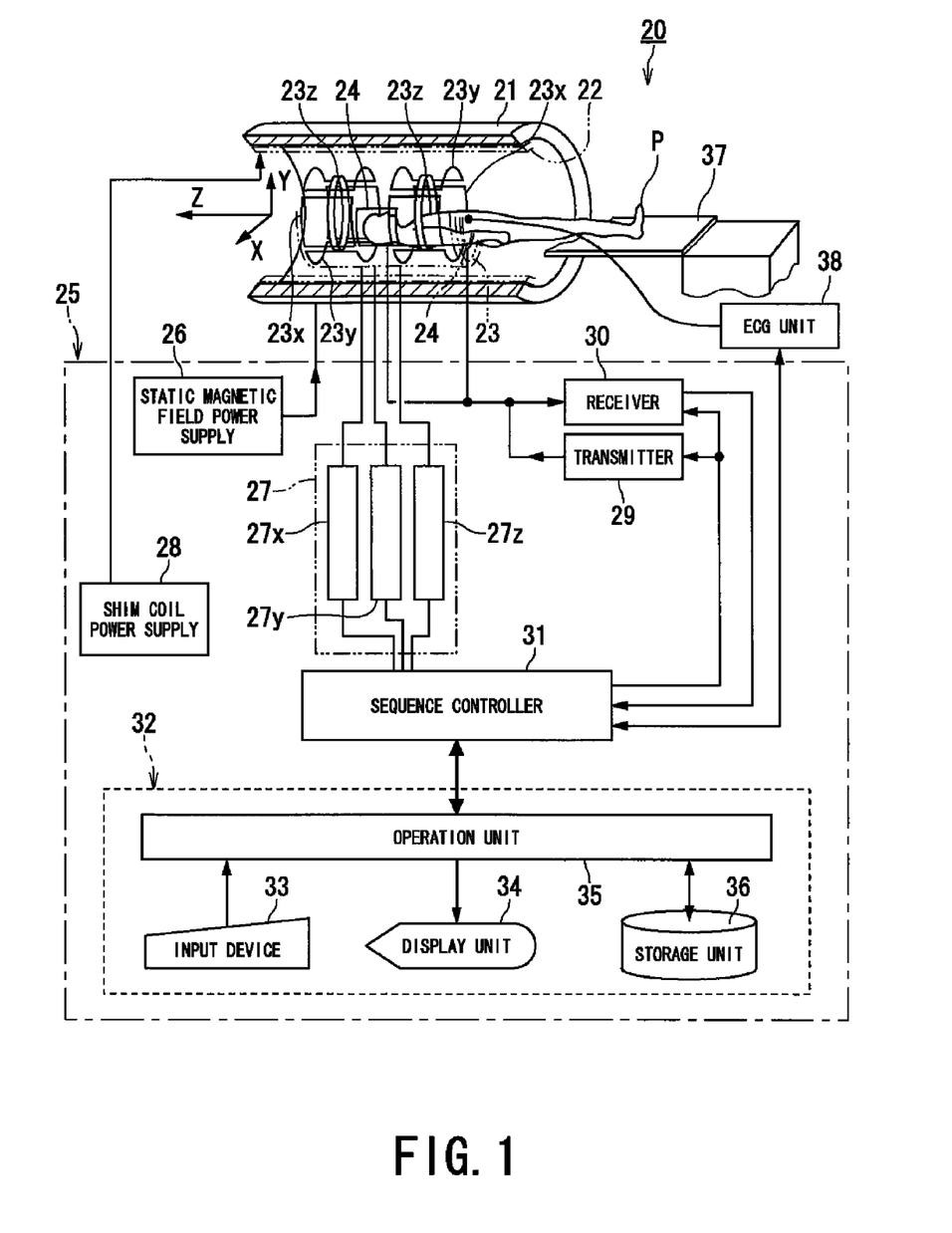
FIG. 1 is a block diagram showing a magnetic resonance imaging apparatus according to an embodiment of the present invention.

FIG. 1 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21, which is cylinder-shaped, a gradient coil 23 and RF coils 24.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, an operation unit 35 and a storage unit 36.

The static field magnet 21 communicates with the static magnetic field power supply 26. The static magnetic field power supply 26 supplies electric current to the static field magnet 21 to get the function to generate a static magnetic field in an imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. The RF coils 24 include a whole body coil (WBC), which is built in the gantry, for transmission and reception of RF signals and local coils, which are arranged around the bed 37 or the object P, for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coils 24 communicate with the transmitter 29 and/or the receiver 30. The transmission RF coil 24 has a function to transmit a RF signal given from the transmitter 29 to the object P. The reception RF coil 24 has a function to receive a MR signal generated due to a nuclear spin inside the object P which is excited by the RF signal to give to the receiver 30.

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and a RF signal by driving the gradient power supply 27, the transmitter 29 and the receiver 30 according to a predetermined sequence stored. The control information above-described includes motion control information, such as intensity, impression period and impression timing of the pulse electric current which should be impressed to the gradient power supply 27.

The sequence controller 31 is also configured to give raw data to the computer 32. The raw data is complex data obtained through the detection of a MR signal and A/D (analog to digital) conversion to the MR signal detected in the receiver 30.

The transmitter 29 has a function to give a RF signal to the RF coil 24 in accordance with control information provided from the sequence controller 31. The receiver 30 has a function to generate raw data which is digitized complex number data by detecting a MR signal given from the RF coil 24 and performing predetermined signal processing and A/D converting to the MR signal detected. The receiver 30 also has a function to give the generated raw data to the sequence controller 31.

In addition, an ECG unit 38 for acquiring an ECG signal of the object P is provided with the magnetic resonance imaging apparatus 20. The ECG signal detected by the ECG unit 38 is outputted to the computer 32 through the sequence controller 31.

Note that, a PPG (peripheral pulse gating) signal representing a beat as pulse wave information may be acquired instead of an ECG signal representing a beat as heart rate information. A PPG signal is acquired by detecting a pulse wave of e.g. tip of a finger as an optical signal. When a PPG signal is acquired, a PPG signal detection unit is provided with the magnetic resonance imaging apparatus 20 instead of the ECG unit 38.

The computer 32 gets various functions by the operation unit 35 executing some programs stored in the storage unit 36 of the computer 32. Alternatively, some specific circuits having various functions may be provided with the magnetic resonance imaging apparatus 20 instead of at least a part of the programs.

Figure 2:
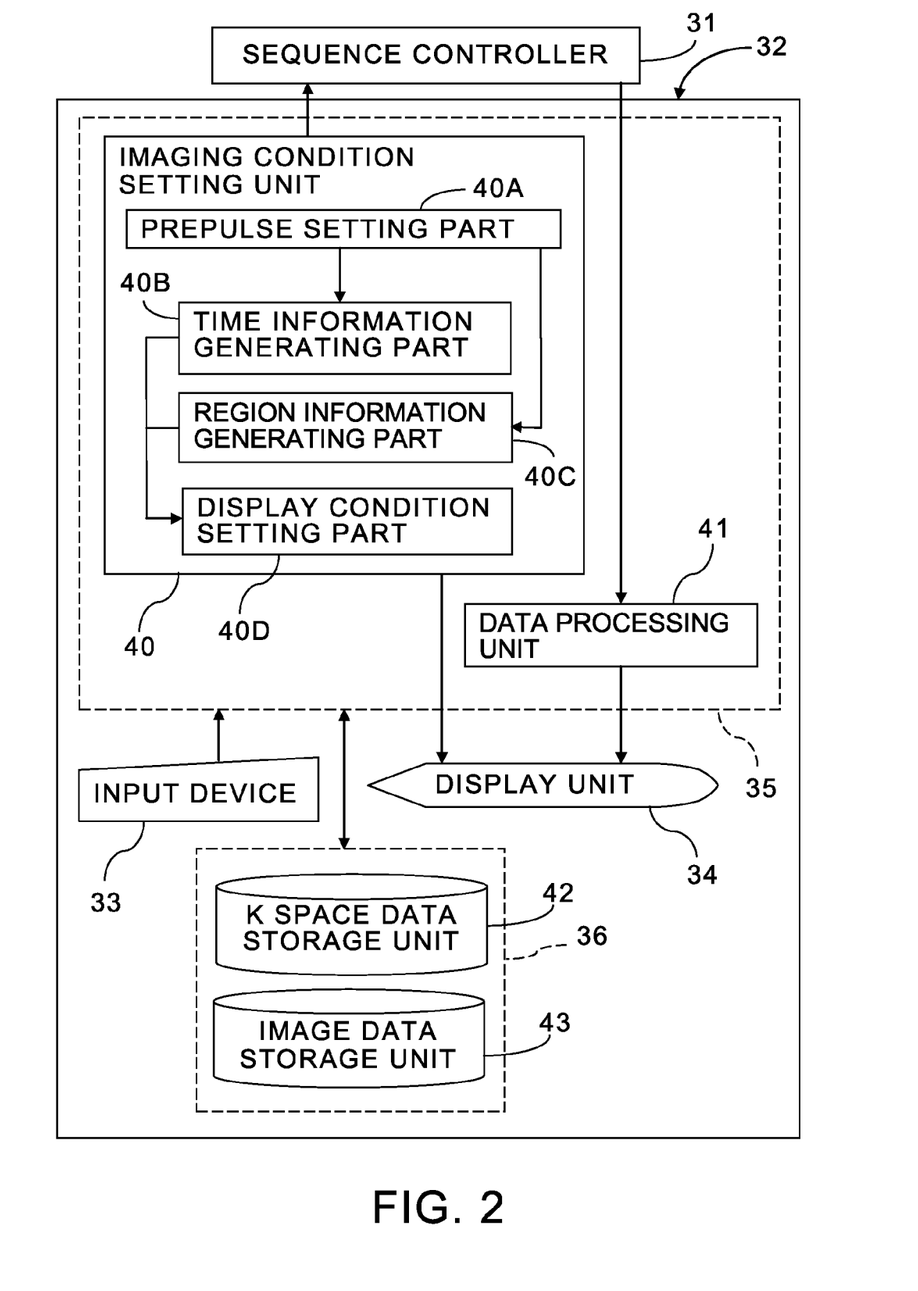
FIG. 2 is a functional block diagram of the computer shown in FIG. 1.

FIG. 2 is a functional block diagram of the computer 32 shown in FIG. 1.

The operation unit 35 of the computer 32 functions as an imaging condition setting unit 40 and a data processing unit 41 by executing some programs stored in the storage unit 36. The imaging condition setting unit 40 has a prepulse setting part 40A, a time information generating part 40B, a region information generating part 40C and a display condition setting part 40D. Furthermore, the storage unit 36 functions as a k-space data storage unit 42 and an image data storage unit 43.

The imaging condition setting unit 40 has a function to set imaging conditions including a pulse sequence based on information from the input device 33 and to output the set imaging conditions to the sequence controller 31. For that purpose, the imaging condition setting unit 40 is configured to display a screen for setting the imaging conditions on the display unit 34 to set the imaging conditions based on the information input from the input device 33 with referring to the screen for setting the imaging conditions.

Especially, the imaging condition setting unit 40 has a function to display a setting screen of RF prepulses, which displays respective application timings of an RF excitation pulse and plural RF prepulses with the time axis, on the display unit 34. The imaging condition setting unit 40 also has a function to set imaging conditions including application timings of RF prepulses according to input information from the input device 33 through the setting screen of RF prepulses.

The time axis for displaying the application timings of the RF excitation pulse and the RF prepulses can be displayed on the setting screen in various forms so long as the time axis allows comparing each application timing of the RF prepulses with the application timing of the RF excitation pulse. For example, when the application timings of the RF excitation pulse and the RF prepulses are displayed on a same time axis, i.e., a single time axis, it is possible to compare each application timing of the RF prepulses with the application timing of the RF excitation pulse. However, plural time axes may be arranged in parallel with a same scale and the application timings of the RF excitation pulse and the RF prepulses may be displayed on the different time axes. Furthermore, plural time axes which are in parallel and have a same scale may be displayed on the setting screen for comparing and displaying the application timings between the RF prepulses.

Examples of imaging conditions set in the imaging condition setting unit 40 include a three dimensional (3D) steady state free precession (SSFP) sequence and a 3D FASE (fast asymmetric spin echo or fast advanced spin echo) sequence to perform MR data acquisition from a spatial region by a 3D scan in a case of imaging a fluid such as a blood flow or a CSF.

Furthermore, when a target having periodicity such as a blood flow is imaged by MRA, a delay time from a reference wave such as an R wave to a data acquisition time and the like are set as imaging conditions so that MR data is acquired at predetermined cardiac time phases in synchronization with a synchronizing signal such as an ECG signal.

The prepulse setting part 40A has functions to set RF prepulses to be applied for obtaining a desired contrast as an imaging condition according to input information from the input device 33 and to edit the application conditions of the RF prepulses set once according to input information from the input device 33.

An IR pulse and a Presat pulse are included in the RF prepulses for adjusting a contrast. The IR pulse is a pulse to invert the longitudinal magnetization vector by 180 degrees. The Presat pulse is a pulse to lay the longitudinal magnetization vector by 90 degrees to saturate spins.

Furthermore, the RF prepulses includes a region selective RF prepulse which allows setting a spatial application region and a region non-selective RF prepulse which does not allow setting an application region. When the region selective RF prepulse is applied, it is possible to perform labeling (tagging) a fluid such as a blood flow included in the application region. Therefore, after an application of the region selective RF prepulse, it becomes possible to depict a fluid flowing out from the application region of the region selective RF prepulse to the outside, or contrary, a fluid flowing into the application region from the outside of the application region selectively.

Especially, the spin labeling pulse for labeling a blood is referred as an ASL pulse. Furthermore, a pulse derived by combing the region selective IR pulse with the region non-selective IR pulse allowing switching between on and off is referred as a t-SLIP.

Note that, the appellative of the ASL pulse in the narrow sense is used for a pulse for inverting a magnetization of blood outside an imaging region to display and enhance the blood having the inverted magnetization is in the imaging region in many cases. On the other hand, the appellative of the t-SLIP can be used not only in the case of flowing a fluid having the inverted magnetization into an imaging region to be imaged but also the case of inverting the magnetization in a background of the imaging region to selectively depict a fluid flowing into the imaging region having the inverted magnetization from the outside.

In the prepulse setting part 40A, application conditions of the plural RF prepulses, which consist of at least one of the region non-selective IR pulse, the region selective IR pulse and the Presat pulse as described above, can be set as imaging conditions so that the RF prepulses are applied in desired application regions at desired timings. Setting and editing of application regions of RF prepulses can be performed through a locator image displayed on a setting screen of RF prepulses. Furthermore, setting and editing of application timings of RF prepulses can be performed with referring to a time axis on which an application timing of an RF excitation pulse and the application timings of the RF prepulses are displayed.

The time information generating part 40B has a function to generate time information for displaying the application timings of the RF excitation pulse and the RF prepulses on at least one comparable time axis according to the application conditions of the RF prepulses set in the prepulse setting part 40A. A same axis can be used for displaying the application timings of the RF excitation pulse and the RF prepulses. However, plural axes having a same scale may be displayed so that the application timings of the RF excitation pulse the RF prepulses can be displayed using the time axes.

The region information generating part 40C has a function to generate region information for displaying on application regions of region selective RF prepulses out of the RF prepulses on a locator image according to the application condition of the RF prepulses set in the prepulse setting part 40A. An imaging region can be added to the region information.

The display condition setting part 40D has a function to set conditions for determining information to be displayed on the setting screen of RF prepulses, among the time information generated in the time information generating part 40B, the region information generated in the region information generating part 40C and editing fields of application conditions of RF prepulses, according to information input from the input device 33. The display condition setting part 40D also has a function to perform display control of the setting screen of RF prepulse according to the set conditions. For example, the display condition setting part 40D can set display conditions such as whether an imaging region and application regions of RF prepulses are displayed on respective locator images or not, application timing of which RF prepulse is displayed emphatically on the time axis and the editing field of application conditions of which RF prepulse is displayed. Then, the display condition setting part 40D can perform display control.

The data processing unit 41 has a function to obtain MR signals from the sequence controller 31 and arrange the obtained MR signals as k-space data in a k-space formed in the k-space data storage unit 42, a function to reconstruct image data by reading k-space data from the k-space data storage unit 42 and performing image reconstruction processing including Fourier transform (FT) of the read k-space data, a function to write image data into the image data storage unit 43, and a function to read image data from the image data storage unit 43 and display the read image data on the display unit 34 after required image processing.

Examples of image processing include maximum intensity projection (MIP) for displaying 3D image data as two dimensional (2D) image data and subtraction processing between frames of image data for depicting a target artery selectively.

Then, the operation and action of the magnetic resonance imaging apparatus 20 will be described.

Figure 3:
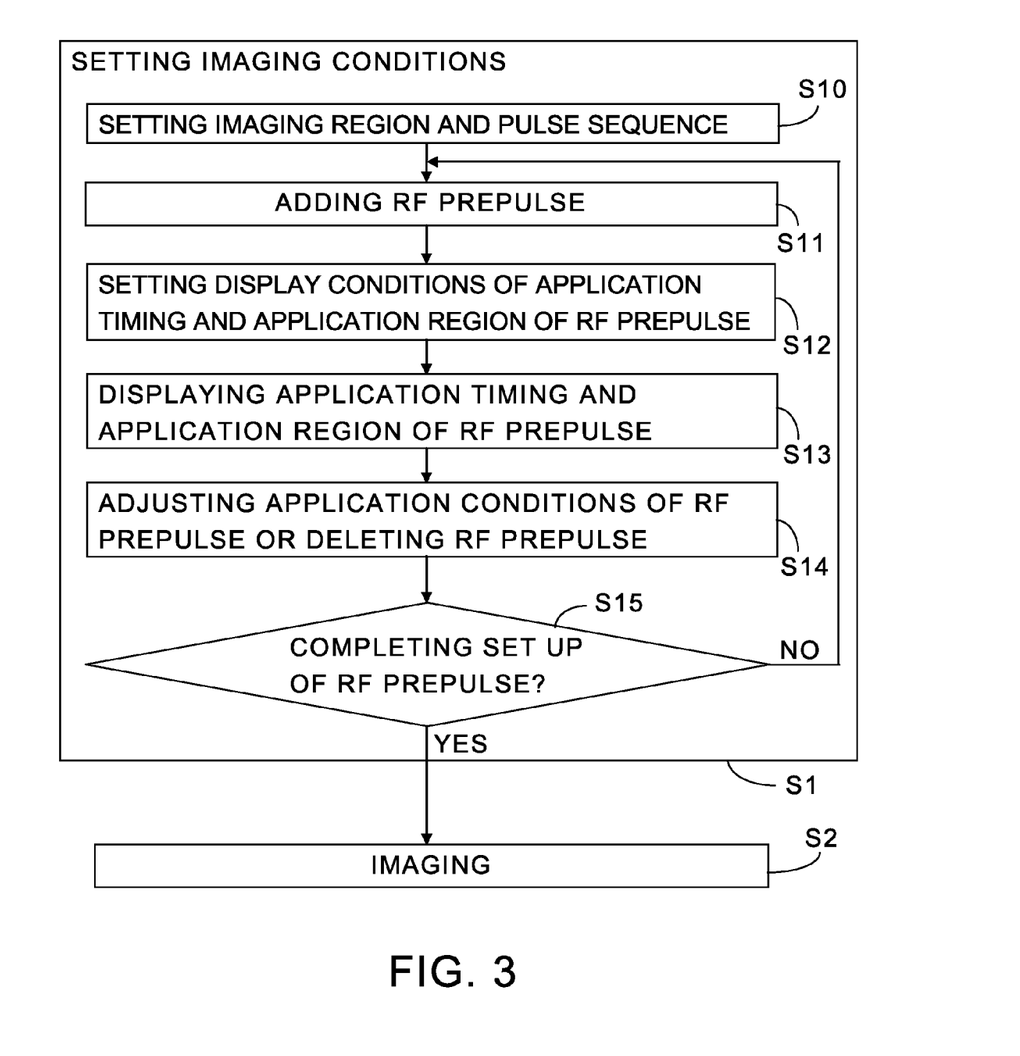
FIG. 3 is a flowchart showing a flow for imaging with setting imaging conditions with applications of RF prepulses by the magnetic resonance imaging apparatus shown in FIG. 1.

FIG. 3 is a flowchart showing a flow for imaging with setting imaging conditions with applications of RF prepulses by the magnetic resonance imaging apparatus 20 shown in FIG. 1.

Firstly, the object P is previously set to the bed 37, and a static magnetic field is generated at an imaging area of the magnet 21 (a superconducting magnet) for static magnetic field excited by the static-magnetic-field power supply 26. Further, the shim-coil power supply 28 supplies current to the shim coil 22, thereby uniformizing the static magnetic field generated at the imaging area.

Furthermore, image data to be reference such as orthogonal three sections image data and positioning image data required for setting imaging conditions such as an imaging region are acquired previously.

Then, in step S1, the setting screen of imaging conditions is displayed on the display unit 34 by the imaging condition setting unit 40. An operator refers to the setting screen of imaging conditions and inputs designated information of various parameters of imaging conditions to the imaging condition setting unit 40 by operating the input device 33.

More specifically, in step S10, imaging conditions including an imaging part, an imaging region and a pulse sequence are set in the imaging condition setting unit 40. Furthermore, in the case of imaging a fluid having periodicity such as a blood flow, a data acquisition timing such as an ECG synchronization is set as an imaging condition.

Next, from step S11 to step S15, application conditions including types, the number, application regions, an application order and application timings of RF prepulses for adjusting a contrast are set as a part of imaging conditions by the prepulse setting part 40A according to information input from the input device 33. Setting of the application conditions of the RF prepulses can be performed by operation of the input device 33 through the setting screen of RF prepulses displayed on the display unit 34. Furthermore, application regions of RF prepulses can be set on locator images including an axial image, a coronal image and a sagittal image displayed on the display unit 34.

Figure 4:
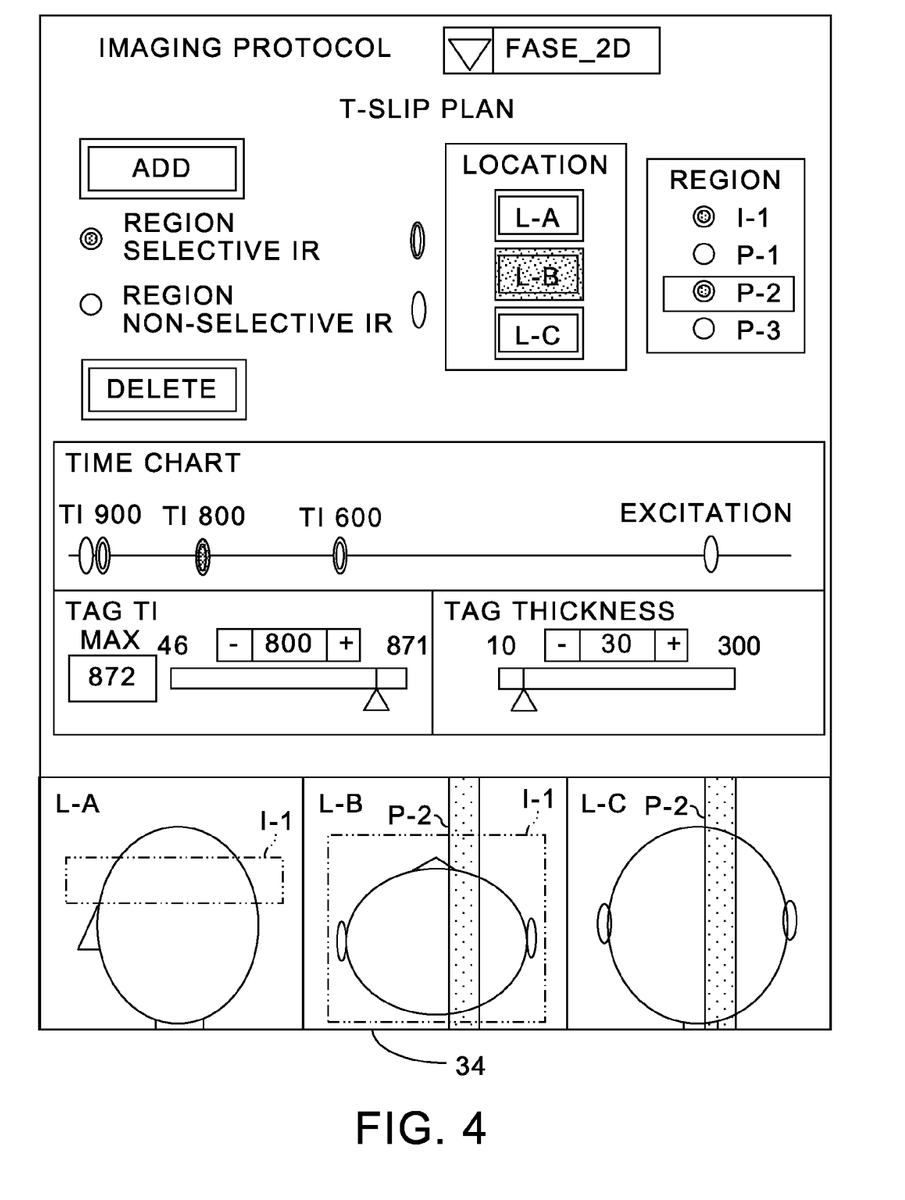
FIG. 4 is a figure showing an example of setting screen of RF prepulses displayed on the display unit 34 by the imaging condition setting unit shown in FIG. 1.

FIG. 4 is a figure showing an example of setting screen of RF prepulses displayed on the display unit 34 by the imaging condition setting unit 40 shown in FIG. 1.

FIG. 4 shows an example of the setting screen of application conditions of IR pulses in the t-SLIP method with application of IR pulses. On the top part, selection information of an imaging protocol is displayed. Furthermore, setting fields of the t-SLIP method is displayed subsequent to the selection information of the imaging protocol. Specifically, electronic keys including an add button for adding an IR pulse and a delete button for deleting an IR pulse, a location section for changing an active locator image by selecting a locator image, a region section for changing a display of an application region of an IR pulse, a time chart section for displaying an application timing of each IR pulse in time series, an editor section for adjusting a TI and a thickness (tag thickness) of an application region of a selected IR pulse and a display section of positioning images used as locators are prepared on the setting screen.

In the example shown in FIG. 4, a 2D FASE sequence is selected as an imaging protocol. Furthermore, an imaging protocol can be selected and changed through a pull-down menu.

When a region selective IR pulse or a region non-selective IR pulse is selected and the add button is pushed by operating the input device 33 in the setting screen shown in FIG. 4, the region selective IR pulse or the region non-selective IR pulse can be added to an imaging sequence by processing in the prepulse setting part 40A. Specifically, in step S11 in FIG. 3, an RF prepulse can be added.

Next, in step S12, display conditions of application timings and application regions of IR pulses set as RF prepulses are set by the display condition setting part 40D. Then, in step S13, the imaging condition setting unit 40 displays an application timing and an application region of each IR pulse on the setting screen of RF prepulses according to the set display conditions. An application timing of an IR pulse can be displayed on the time axis in the time chart section. Furthermore, an application region of an IR pulse can be displayed on each locator image.

In the example shown in FIG. 4, application timings of respective IR pulses and RF excitation pulse are shown on the time axis of the time chart section so as to be able to recognize the application timings visibly. Specifically, figures which show application timings of IR pulses and an RF excitation pulse are displayed on the time axis.

Furthermore, the first figure to show a region selective pulse and the second figure to show a region non-selective pulse can be displayed on the time axis. Then, a region selective pulse and a region non-selective pulse can be identified mutually on the time axis by making the second figure different from the first figure.

In the example shown in FIG. 4, each region selective IR pulse is shown with a double oval and each region non-selective IR pulse is shown with an oval that is not double. Therefore, a user can grasp types and temporal relative relation in application timings of respective IR pulses clearly.

Near the figure which shows an application timing of each IR pulse, a TI of each IR pulse is shown as a numerical value. Therefore, an application timing of each IR pulse can be grasped numerically by a TI. For example, it is confirmed that a region selective IR pulse is applied as TI=900 [ms] subsequently to an application of a region non-selective IR pulse almost at a same time. Note that, since a TI corresponds to a time from an application timing of an RF excitation pulse, the TI value becomes larger at a more retroactive time on the basis of the RF excitation pulse at the right end.

Furthermore, a target IR pulse is emphatically displayed on the time axis. The TI and the tag thickness of the IR pulse displayed emphatically can be adjusted in the editor section provided below the time chart section.

The target IR pulses of which application conditions are adjusted through the editor section can be selected from choices corresponding to the first IR pulse P-1, the second IR pulse P-2 and the third IR pulse P-3 displayed on the region section respectively. FIG. 4 shows a state that the second IR pulse P-2 has been selected. Accordingly, the IR pulse emphatically displayed on the time axis in the time chart section corresponds to the second IR pulse P-2.

On the other hand, display conditions of application regions of IR pulses can be set through the location section and the region section. Specifically, when one is selected from the choices respectively corresponding to the first, the second and the third three locator images L-A, L-B and L-C displayed in the location section, the locator image corresponding to the selected choice becomes active. In the example shown in FIG. 4, the second locator image L-B is active since the choice corresponding to the second locator image L-B has been selected.

Next, whether the imaging region I-1 and the respective application regions of the first IR pulse P-1, the second IR pulse P-2 and the third IR pulse P-3 are displayed on the active locator image or not can be set by using the radio buttons displayed in the region section to switch on and off of the imaging region I-1 and the choices corresponding to the first, the second and the third IR pulses P-1, P-2, P-3.

In the example shown in FIG. 4, the display conditions of application regions of IR pulses are set so that the imaging region I-1 and the application region of the second IR pulse P-2 are displayed on the second locator image L-B. Accordingly, only the imaging region I-1 and the application region of the second IR pulse P-2 are displayed on the second locator image L-B without displaying the application regions of the first and the third IR pulses P-1 and P-3.

Furthermore, by setting similar display conditions, only the imaging region I-1 is displayed on the first locator image L-A and only the application region of the second IR pulse P-2 is displayed on the third locator image L-C. As described above, application regions of IR pulses to be displayed can be changed for each locator image. Therefore, application regions of IR pulses which become bothersome depending on a section direction of a locator image can be in nondisplay.

Furthermore, the application region of the IR pulse selected in the time chart section and the editor section can be also displayed emphatically on each locator image. In the example shown in FIG. 4, the second IR pulse P-2 is displayed emphatically in the time chart section. Therefore, the application region of the second IR pulse P-2 is also cooperatively displayed emphatically on the second locator image L-B and the third locator image L-C set so that the application region of the second IR pulse P-2 is displayed.

As described above, application regions of selected RF prepulse out of plural RF prepulses can be displayed emphatically on at least one locator image while application timings of the selected RF prepulses are displayed emphatically on the time axis. Therefore, in the example shown in FIG. 4, it becomes possible for a user to adjust the application conditions through the editor section with referring to the application timings and the application regions of the selected IR pulses.

Note that, from the perspective of preventing the complexity, it is practical to perform a display control so that a region non-selective pulse is not displayed on each locator image to be a display region for application regions of region selective pulses while the region non-selective pulse is displayed on the time axis in the time chart section. In this case, the imaging condition setting unit 40 is configured to display a setting screen, which displays application timings of RF prepulses including a region non-selective pulse on the time axis and does not display application information of the region non-selective pulse on each display region for application regions of region selective pulses, on the display unit 34. Specifically, the imaging condition setting unit 40 performs a display control to distinguish a region selective pulse from a region non-selective pulse not so as to display information, indicating whether a region non-selective pulse is applied or not, on each locator image.

On the contrary, information, indicating whether a region non-selective pulse is applied or not, may be displayed on a locator image. For example, whether a region non-selective pulse is applied or not can be identified by changing display aspects such as a line type and/or a color of the frame lines of each locator image to be a display region for application regions of region selective pulses. In this case, the imaging condition setting unit 40 is configured to display a setting screen, which displays application timings of RF prepulses including a region non-selective pulse on the time axis and application information of the region non-selective pulse on display regions of application regions of region selective pulses, on the display unit 34. Specifically, the imaging condition setting unit 40 performs a display control to distinguish a region selective pulse from a region non-selective pulse to display information, indicating whether a region non-selective pulse is applied or not, on each locator image in a way other than a frame showing a region.

Then, when application timings and application regions of respective IR pulses are displayed on the setting screen, it becomes possible to adjust application conditions including application timing, a tag thickness and an application region of a selected IR pulse in step S14.

When application timing of an IR pulse is adjusted, the application timing can be changed by operating a scroll bar for adjusting a TI displayed in the editor section. In the example shown in FIG. 4, a TI of the IR pulse applied at first is 900 [ms]. Accordingly, 872 [ms], derived by taking a pulse length 28 [ms] of the IR pulse from 900 [ms], is displayed automatically as the maximum value of TI which can be set for the second IR pulse P-2 applied secondly. Similarly, the lower limit of TI of the second IR pulse P-2, to which a pulse length of the RF excitation pulse is also considered, is set to 46 [ms] automatically.

Therefore, a user can adjust a TI within a variable range from 46 [ms] to 872 [ms] by operating the input device 33 through the setting screen. Specifically, when a changed TI value is input to the prepulse setting part 40A from the input device 33, the prepulse setting part 40A updates a set value of the TI. Then, the time information generating part 40B generates time information for displaying a new application timing of the second IR pulse P-2 on the time axis according to the TI updated in the prepulse setting part 40A.

On the other hand, the display condition setting part 40D performs a display control for displaying the application timing of the second IR pulse P-2 on the time axis emphatically according to setting in the region section. This makes the TI of the second IR pulse P-2 displayed emphatically on the time axis updated and the figure which shows the second IR pulse P-2 moves to a position corresponding to the updated TI. As described above, when respective application timings of RF prepulses have been adjusted, the positions of the figures displayed for showing the RF prepulses on the time axis can be updated to positions corresponding to respective adjusted application timings.

Furthermore, tag thicknesses can be also changed by operating the scroll bar for adjusting a tag thickness displayed in the editor section. With regard to the tag thickness, the maximum value and the minimum value to be able to be set can be also displayed automatically.

When a changed value of the tag thickness is input to the prepulse setting part 40A by operating the input device 33, the prepulse setting part 40A updates a setting value of the tag thickness of the second IR pulse P-2. Then, the region information generating part 40C generates region information for displaying a new tag thickness of the second IR pulse P-2 on the first, the second and the third locator images L-A, L-B and L-C according to the tag thickness updated in the prepulse setting part 40A.

On the other hand, the display condition setting part 40D performs a display control so that the tag thickness of the second IR pulse P-2 is displayed emphatically on the second locator image L-B and the third locator image L-C according to settings in the location section and the region section. Consequently, the tag thickness of the second IR pulse P-2 displayed emphatically as an application region on the second locator image L-B and the third locator image L-C is updated and the application region corresponding to the updated tag thickness is displayed emphatically on the second locator image L-B and the third locator image L-C.

Furthermore, the application region of the second IR pulse P-2 can be also adjusted via the first, the second and the third locator images L-A, L-B and L-C. In that case, the application region of the second IR pulse P-2 can be changed by enlarging or reducing the application region of the second IR pulse P-2, displayed emphatically as the rectangular frames on the second locator image L-B and the third locator image L-C, by operating the input device 33.

In this case, information for changing the application region of the second IR pulse P-2 is input to the prepulse setting part 40A from the input device 33. Then, the application region of the second IR pulse P-2 displayed emphatically on the second locator image L-B and the third locator image L-C is updated by an action of the region information generating part 40C and a display control of the display condition setting part 40D, similarly to a case of updating a tag thickness.

In addition to adjusting application conditions of IR pulses as described above, an IR pulse set once can be also deleted. In this case, the IR pulse selected by setting in the region section can be deleted by pushing the delete button. Specifically, when the delete button is pushed, an instruction of deleting the IR pulse selected by setting in the region section is input to the prepulse setting part 40A from the input device 33. Then, the prepulse setting part 40A deletes the setting information of the IR pulse selected by setting in the region section.

Addition of an IR pulse, setting of display conditions, displaying application conditions of IR pulses, and editing application conditions of IR pulses as described above can be repeated until instruction information of completing setting up of IR pulses is input to the prepulse setting part 40A.

When the add button is pushed to add an IR pulse, the prepulse setting part 40A may set default values of an application timing and an application region automatically. In this case, the default values of the application timing and the application region can be variable values according to IR pulses which have already been set as well as predetermined fixed values. For example, a default value of an application timing of an added IR pulse is set to application timing adjacent to that of the IR pulse, of which TI is the shortest, at a predetermined interval.

Note that, after plural IR pulses have been set, display conditions may be set in step S12 without adding an IR pulse in step S11.

Figure 5:
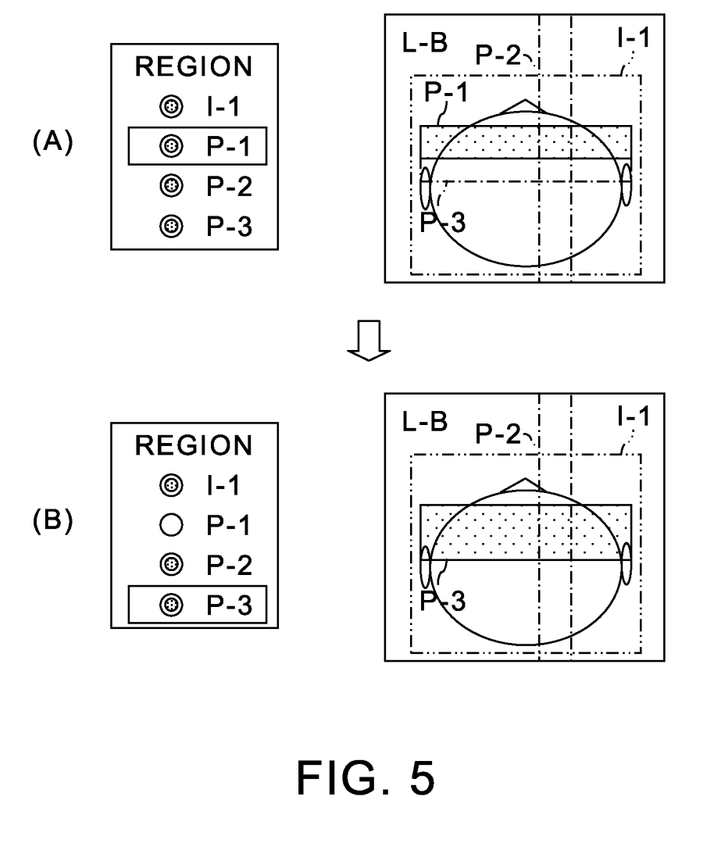
FIG. 5 is a figure which shows a change in the region information when the display conditions are changed on the setting screen of RF prepulses shown in FIG. 4.

FIG. 5 is a figure which shows a change in the region information when the display conditions are changed on the setting screen of RF prepulses shown in FIG. 4.

(A) and (B) in FIG. 5 show display states of the second locator image L-B corresponding to settings of the region section respectively. For example, when the radio buttons in the region section are set so that all of the imaging region I-1 and the respective application regions of the first, the second and the third IR pulses P-1, P-2 and P-3 are displayed as shown in FIG. 5 (A), all of the imaging region I-1 and the respective application regions of the first, the second and the third IR pulses P-1, P-2 and P-3 are displayed on the second locator image L-B.

Furthermore, when the first IR pulse P-1 is set to active as shown in the region section of FIG. 5 (A), the application region of the first IR pulse P-1 is displayed emphatically on the second locator image L-B. In this case, it becomes possible to adjust the TI and the tag thickness of the first IR pulse P-1 in the editor section while the figure indicating the first IR pulse P-1 is displayed emphatically on the time axis in the time chart section.

Similarly, when only the application region of the first IR pulse P-1 is set not so as to be displayed as shown in the region section of FIG. 5 (B), the application region of the first IR pulse P-1 disappears from the second locator image L-B. Furthermore, when the third IR pulse P-3 is set to active as shown in the region section of FIG. 5 (B), the application region of the third IR pulse P-3 is displayed emphatically in the second locator image L-B. Meanwhile, it becomes possible to adjust the TI and the tag thickness of the third IR pulse P-3 in the editor section.

As described above, application regions of region selective pulses out of RF prepulses can be displayed on locator images and an application region of a selected region selective pulse on a selected locator image can be changed to non-display. Furthermore, the display condition setting part 40D can perform a display control so that a user interface (UI) for adjusting application conditions for a selected RF prepulse out of RF prepulses is changed and displayed on the display unit 34.

Accordingly, even when the application region of the first IR pulse P-1 is overlapped with the application region of the third IR pulse P-3 as shown in (A) and (B) of FIG. 5 for example, displaying an application region and adjusting application conditions can be performed individually for each IR pulse. Therefore, a user can grasp and adjust an application region of each IR pulse easily.

Note that, in the example shown in FIG. 4, the TI of the region non-selective IR pulse may not be a variable value and can be set automatically to immediately prior to the region selective IR pulse which is applied first or the like In that case, the region non-selective IR pulse is switched only between on and off.

Figure 6:
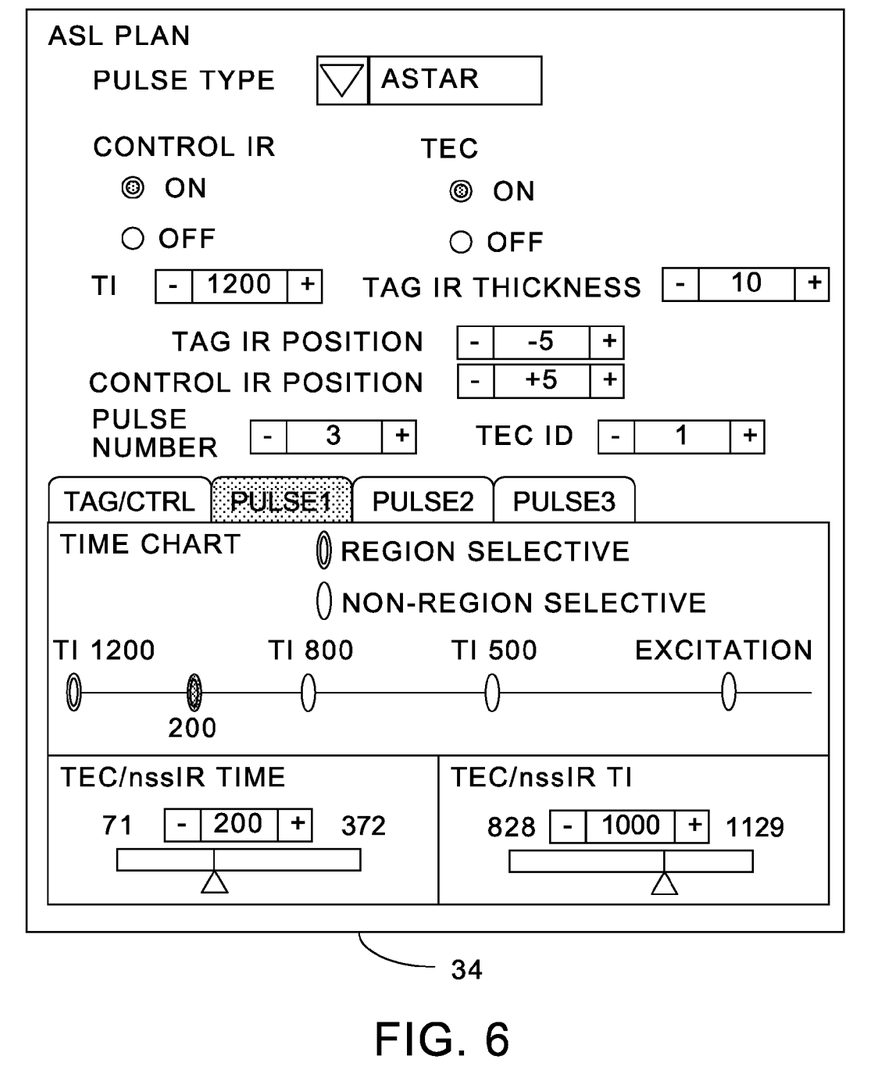
FIG. 6 is a figure showing another example of setting screen of RF prepulses displayed on the display unit by the imaging condition setting unit shown in FIG. 1.

FIG. 6 is a figure showing another example of setting screen of RF prepulses displayed on the display unit 34 by the imaging condition setting unit 40 shown in FIG. 1.

FIG. 6 shows an example of a setting screen of application conditions of an ASL pulse. On the top part, a pull-down menu for selecting a type of ASL pulse is provided. In the example shown in FIG. 6, the type known as the ASTAR (Modified STAR (Signal Targeting Alternating Radio Frequency) Using Asymmetric Inversion Slabs) method has been selected.

The ASL pulse in the ASTAR method includes an IR pulse for tag, an IR pulse for control, a TEC (Tag End Cut) pulse and non-slice selective IR (nssIR) pulses as elements. Note that, the TEC pulse is a Presat pulse applied in an application region same as that of the IR pulse for tag after a predetermined period from an application timing of the IR pulse for tag which is a region selective IR pulse.

The IR pulse for control and the TEC pulse can be switched between on and off. Therefore, the radio buttons for switching the IR pulse for control and the TEC pulse between on and off are provided. When the IR pulse for control is on, data acquisition in the tag mode with applying the IR pulse for tag and data acquisition in the control mode with applying the IR pulse for control instead of the IR pulse for tag are performed severally.

Furthermore, regarding the required IR pulse for tag, sections for varying numerical values of the TI and the tag thickness are provided. In the example shown in FIG. 6, the TI of the IR pulse for tag has been set to 1200 [ms] and the tag thickness of the IR pulse for tag is set to 10 [mm].

Furthermore, sections for setting application regions of the IR pulse for tag and the IR pulse for control are provided. In the ASTAR method, respective application regions of the IR pulse for tag and the IR pulse for control are set so that an imaging slab to be an imaging region lies between the application regions. Therefore, in the example shown in FIG. 6, a slab, of which center is a position where the center position of the imaging slab is moved by the offset of −5 [mm] in the normal direction, has been set as an application region of the IR pulse for tag while a slab, of which center is a position where the imaging slab is moved by the offset of +5 [mm] in the normal direction, has been set as an application region of the IR pulse for control.

On the other hand, a single TEC pulse and plural nssIR pulses can be set in an arbitrary order subsequently to applying the IR pulse for tag or the IR pulse for control. Accordingly, a section for setting the number of pulses applied after applying the IR pulse for tag by a numerical value and a section for setting an application order of the TEC pulse as a numerical value can be provided. In the example shown in FIG. 6, three pulses have been set subsequently to applying the IR pulse for tag and the first pulse which is applied first has been set to the TEC pulse. Accordingly, the second and the third pulses which are applied secondly and thirdly are automatically set as nssIR pulses respectively.

These conditions can be set in the prepulse setting part 40A. Then, the set application timings of respective pulses can be displayed on the comparable time axis or time axes in the time chart section. FIG. 6 shows an example of displaying figures indicating respective pulses on a single time axis. In the example shown in FIG. 6, the double oval indicates a region selective pulse and the oval that is not double indicates a region non-selective pulse, similarly to the example shown in FIG. 4.

In the ASTAR method, the IR pulse for tag, the IR pulse for control and the TEC pulse are included in the region selective pulses. Accordingly, the first pulse of which TI=1200 [ms], which may be the IR pulse for tag or the IR pulse for control, and the second TEC pulse are shown by the double oval. On the other hand, the respective other nssIR pulses are shown by the oval that is not double since they are region non-selective pulses.

At the upper parts of the figures which show the IR pulse for tag, the IR pulse for control and each nssIR pulse, TIs corresponding to offset times from the application timing of the RF excitation pulse are displayed as numerical values. On the other hand, application timing of the TEC pulse is set as an elapsed time from the application timing of the IR pulse for tag. Accordingly, at the bottom part of the figure which shows the TEC pulse, an elapsed time from the application timing of the IR pulse for tag is displayed as a numerical value. This enables to confirm a temporal relative relation between respective pulses in the ASTAR method visually with referring to temporal parameters of the respective pulses as numerical values.

As described above, at least one of elapsed times from an arbitrary pulse and TIs, corresponding to plural RF prepulses, can be displayed together with figures indicating the RF prepulses on the time axis according to a type of an RF prepulse and an imaging method.

Furthermore, similarly to the example shown in FIG. 4, one of pulses displayed on the time axis can be displayed emphatically and application conditions of a selected pulse can be edited. However, the example shown in FIG. 6 shows a screen structure in which a pulse is selected by selecting a tab. Specifically, tabs for respective pulses are prepared so that a pulse to be edited can be changed by selecting a tab. As described above, a setting screen, in which respective screens for editing application conditions of RF prepulses independently can be changed using tabs to be displayed, can be displayed on the display unit 34 by the imaging condition setting unit 40.

In the example shown in FIG. 6, applications of the first, the second and the third pulses are set subsequent to applying the IR pulse for tag and the IR pulse for control. Therefore, four tabs, including a tab for selecting the IR pulse for tag or the IR pulse for control, a tab for selecting the first pulse, a tab for selecting the second pulse and a tab for selecting the fourth pulse, are displayed so as to be able to be selected.

In the example shown in FIG. 6, the tab for selecting the second pulse has been selected. Therefore, the nssIR pulse which is applied secondly after applying the IR pulse for tag or the IR pulse for control is displayed emphatically on the time axis in the time chart section. Then, an elapsed time from the IR pulse for tag or the IR pulse for control and a TI of the selected IR pulse can be adjusted by operating the scroll bars and the like in the editor section provided below the time chart section.

Note that, the sum of the elapsed time from the IR pulse for tag or the IR pulse for control and the TI corresponds to a TI of the IR pulse for tag or the IR pulse for control. Therefore, when one of the elapsed time from the IR pulse for tag or the IR pulse for control and the TI is adjusted, the other is updated automatically.

Such editing of application conditions of pulses can be performed by processing and operations from step S11 to step S15 in FIG. 3, similarly to editing through the setting screen shown in FIG. 4. Note that, in the example shown in FIG. 6, adding and deleting a pulse can be performed by changing the number of pulses applied subsequent to applying the IR pulse for tag.

Furthermore, changing between the TEC pulse and an nssIR pulse can be performed by changing an application order of the TEC pulse. Specifically, a selected RF prepulse out of RF prepulses can be changed to a region non-selective pulse from a region selective pulse or to a region selective pulse from a region non-selective pulse.

In the case of the ASTAR method, an application region of a region selective pulse is set as a relatively simple region. Especially, the application region of the TEC pulse is set to an application region of the IR pulse for tag. Therefore, in the ASTAR method, even if an application region of a region selective pulse is displayed on locator images, the application region of the IR pulse for tag always overlaps with the application region of the TEC pulse and an application region of RF prepulse which does not overlap is only the application region of the IR pulse for control.

Accordingly, as illustrated by the example of FIG. 6, displaying locator images can be omitted from a setting screen of RF prepulse in the ASTAR method. As described above, a setting screen of RF prepulse may be a screen having the time chart section and the editor section mainly depending on a type of RF prepulse.

Therefore, in the case of the screen structure shown in FIG. 6, time information displayed in the time chart section is generated in the time information generating part 40B. Furthermore, displaying emphatically in the time chart section and changing the editor section, based on selection information of a tab, can be performed by display control of the display condition setting part 40D.

Other than examples shown in FIG. 4 and FIG. 6, a selection form from a list, a selection form from a pop-up display and the like, which are used for a general UI, can be also used for constructing a setting screen of RF prepulse. Furthermore, other application conditions of IR pulse such as a flip angle (FA) may be also adjusted in the editor section.

When setting the RF prepulses is completed and information which instructs completing the setup is input to the prepulse setting part 40A from the input device 33, the prepulse setting part 40A determines that the setup of the RF prepulses has been completed in step S15 in FIG. 3. Then, other required imaging conditions are set in the imaging condition setting unit 40.

Next, in step S2 in FIG. 3, elements for imaging, including the sequence controller 31 and the static field magnet 21, of the magnetic resonance imaging apparatus 20 perform imaging according to the imaging conditions including application conditions of the RF prepulses set in the imaging condition setting unit 40.

Specifically, the imaging conditions including a pulse sequence are output from the imaging condition setting unit 40 to the sequence controller 31. The sequence controller 31 drives the gradient power supply 27, the transmitter 29 and the receiver 30 in accordance with the pulse sequence, thereby generating a gradient magnetic field at the imaging area having the set object P, and further generating RF signals including the RF prepulses and the RF excitation pulse from the RF coil 24.

Consequently, the RF coil 24 receives MR signals generated due to nuclear magnetic resonance in the object P. Then, the receiver 30 receives the MR signals from the RF coil 24 and generates raw data which is digital data of the MR signals by necessary signal processing and subsequent A/D conversion of the MR signals. The receiver 30 supplies the MR signals to the sequence controller 31. The sequence controller 31 outputs the MR signals to the computer 32.

Then, the data processing unit 41 acquires the MR signals from the sequence controller 31 and arranges the MR signals as k-space data in the k-space formed in the k-space data storage unit 42.

In MRA, the acquisition and arrangement of the k-space data described above are often performed in synchronized with an ECG signal. In that case, the ECG signal acquired by the ECG unit 38 is output to the sequence controller 31 and used as a synchronization signal.

Furthermore, the k-space data is acquired as MR signals, of which signal intensities are weighted or suppressed by RF prepulses such as a region selective IR pulse and a region non-selective IR pulse, from a specific target such as a blood flow in a target blood vessel.

Next, image data is generated based on the k-space data acquired by the imaging scan. Specifically, the data processing unit 41 reconstructs the image data by reading the k-space data from the k-space data storage unit 42 and performing image reconstruction processing of the read k-space data. Then, the generated image data is displayed on the display unit 34 after required image processing.

Consequently, an MR image such as a blood flow image having a contrast adjusted by the RF prepulses is displayed on the display unit 34. Then, the image data is stored in the image data storage unit 43, as required.

That is, the magnetic resonance imaging apparatus 20 as described above is an apparatus configured to display respective application timings of plural RF prepulses on the time axis, of which reference is the RF excitation pulse, in a GUI for setting RF prepulses. Furthermore, the magnetic resonance imaging apparatus 20 is the apparatus configured to change a UI, for editing application regions displayed on locator images respectively and application conditions of RF prepulses, for each RF prepulse to be displayed.

Therefore, according to the magnetic resonance imaging apparatus 20, application conditions of RF prepulses applied at mutually different timings can be set with grasping a temporal relative relation and an application order of the RF prepulses easily. Specifically, it can be promptly grasped that which RF prepulse is applied in which application region at each time prior to applying the RF excitation pulse.

Furthermore, an application region of a specific RF prepulse can be hided on each locator image. Therefore, even when application regions of RF prepulses are mutually overlapped, a target RF prepulse can be easily selected on a locator image. Then, the application conditions of the selected RF prepulse can be edited with confirming the application region.

Furthermore, since the application region on the locator images is displayed emphatically in conjunction with the RF prepulse displayed emphatically on the time axis, a temporal relative relation and a spatial relative relation between RF prepulses can be grasped with association.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
a control system including a computer configured to display a setting screen of a radio frequency prepulse on a display unit to set imaging conditions including application timings of radio frequency prepulses according to input information from an input device through the setting screen, the setting screen displaying an application timing of a radio frequency excitation pulse and the application timings of the corresponding radio frequency prepulses on a time axis; and
an assembly operatively coupled to the control system and including a magnet, a gradient coil and at least one radio frequency coil, the assembly configured to perform imaging of an object according to the imaging conditions.

2. A magnetic resonance imaging apparatus of claim 1, wherein said computer is configured to display an application region of a region selective pulse among the radio frequency prepulses on positioning images and to provide for changing an application region of a selected region selective pulse to non-display on a selected positioning image.

3. A magnetic resonance imaging apparatus of claim 1, wherein said computer is configured to display an application region of a region selective pulse among the radio frequency prepulses and to provide for changing an application region of a selected region selective pulse to not display.

4. A magnetic resonance imaging apparatus of claim 1, wherein said computer is configured to display an application region of a region selective pulse among the radio frequency prepulses.

5. A magnetic resonance imaging apparatus of claim 1, wherein said computer is configured to perform a display control to change and display a user interface on a display unit, the user interface being for adjusting an application condition for a selected radio frequency prepulse of the radio frequency prepulses.

6. A magnetic resonance imaging apparatus of claim 1, wherein said computer is configured to provide for changing a selected radio frequency prepulse out of the radio frequency prepulses, from a region selective pulse to a region non-selective pulse or from the region non-selective pulse to the region selective pulse.

7. A magnetic resonance imaging apparatus of claim 1, wherein said computer is configured to display a first figure showing a region selective pulse and a second figure showing a region non-selective pulse on the time axis, the second figure being different from the first figure.

8. A magnetic resonance imaging apparatus of claim 1, wherein said computer is configured to display figures showing the radio frequency prepulses on the time axis and to update positions of the figures to positions corresponding to adjusted application timings when application timings of the radio frequency prepulses are adjusted.

9. A magnetic resonance imaging apparatus of claim 1, wherein said computer is configured to display an application timing of a selected radio frequency prepulse of the radio frequency prepulses emphatically on the time axis and to display an application region of the selected radio frequency prepulse emphatically on at least one positioning image.

10. A magnetic resonance imaging apparatus of claim 1, wherein said computer is configured to display at least one of elapsed times from an arbitrary pulse and inversion recovery times corresponding to the radio frequency prepulses with figures indicating the radio frequency prepulses on the time axis.

11. A magnetic resonance imaging apparatus of claim 1, wherein said computer is configured to set imaging conditions including application timings of radio frequency prepulses consisting of at least one of a region non-selective inversion recovery pulse, a region selective inversion recovery pulse and a presaturation pulse.

12. A magnetic resonance imaging apparatus of claim 4, wherein said computer is configured to display application timings of the radio frequency prepulses including a region non-selective pulse on the time axis and to display a setting screen on the display unit, the setting screen displaying information other than application information of the region non-selective pulse on a display region of the application region of the region selective pulse.

13. A magnetic resonance imaging apparatus of claim 4, wherein said computer is configured to display application timings of the radio frequency prepulses including a region non-selective pulse on the time axis and to display a setting screen on the display unit, the setting screen displaying application information of the region non-selective pulse on a display region of the application region of the region selective pulse.

14. A magnetic resonance imaging apparatus of claim 1, wherein said computer is configured to display a setting screen on the display unit, the setting screen displaying a screen for independently editing an application condition of each of the radio frequency prepulses, the screen being changeable to another screen by a tab displayed on the display unit.

15. A magnetic resonance imaging apparatus of claim 1, wherein said computer is configured to display the setting screen of the radio frequency prepulses on the display unit, the setting screen displaying the application timing of the radio frequency excitation pulse and the application timings of the radio frequency prepulses on a same time axis.

16. A magnetic resonance imaging method comprising:
displaying a setting screen of a radio frequency prepulse on a display unit to set imaging conditions including application timings of radio frequency prepulses according to input information from an input device through the setting screen, the setting screen displaying an application timing of a radio frequency excitation pulse and the application timings of the corresponding radio frequency prepulses on a time axis; and
performing imaging of an object according to the set imaging conditions.

* * * * *